United States Patent
Carsten

(10) Patent No.: US 6,597,592 B2
(45) Date of Patent: *Jul. 22, 2003

(54) APPARATUS AND METHOD FOR TURNING OFF BJT USED AS CONTROLLED RECTIFIER

(76) Inventor: Bruce W. Carsten, 6410 NW. Sisters Pl., Corvallis, OR (US) 97330-9243

( * ) Notice: Subject to any disclaimer, the term of this patent is extended or adjusted under 35 U.S.C. 154(b) by 0 days.

This patent is subject to a terminal disclaimer.

(21) Appl. No.: 09/971,048

(22) Filed: Oct. 3, 2001

(65) Prior Publication Data

US 2003/0063483 A1 Apr. 3, 2003

(51) Int. Cl.[7] .......................... H02M 7/217; H02M 5/42
(52) U.S. Cl. ........................................ 363/127; 363/89
(58) Field of Search ............................ 363/127, 89, 97, 363/98, 17, 16; 323/282, 283, 284, 285, 286, 272, 278; 361/84, 91, 92, 93, 94

(56) References Cited

U.S. PATENT DOCUMENTS

| | | | |
|---|---|---|---|
| 3,582,758 A | | 6/1971 | Gunn |
| 3,629,622 A | * | 12/1971 | Denenberg, Jr. ............ 307/297 |
| 3,909,700 A | | 9/1975 | Ferro |
| 3,940,682 A | | 2/1976 | Park et al. |
| 4,311,954 A | * | 1/1982 | Capel ........................ 323/222 |
| 4,323,962 A | | 4/1982 | Steigerwald |
| 4,495,537 A | * | 1/1985 | Laude ......................... 361/98 |
| 4,589,049 A | * | 5/1986 | Krumrein .................... 361/56 |
| 4,716,514 A | | 12/1987 | Patel |
| 4,787,007 A | * | 11/1988 | Matsumura et al. .......... 361/98 |
| 4,839,769 A | * | 6/1989 | Soo et al. .................... 361/84 |
| 4,940,906 A | * | 7/1990 | Gulczynski ................ 307/296 |
| 5,434,739 A | * | 7/1995 | Heck .......................... 361/84 |
| 5,905,368 A | | 5/1999 | Kolluri et al. |

OTHER PUBLICATIONS

"A New Synchronous Rectifier Using Bipolar Junction Transistor Driven by Current Transformer", Eiji Saki et al, IEEE INTELEC Conference, 1992, pp. 424–429, (no date).

* cited by examiner

Primary Examiner—Rajnikant B. Patel
(74) Attorney, Agent, or Firm—Steven J. Adamson

(57) ABSTRACT

A controlled rectifier circuit having a BJT implemented as the controlled rectifier (CR) and first and second turn-off transistors coupled respectively between the base and collector and base and emitter of the CR BJT to rapidly remove stored charge from the collector-base junction of that CR BJT. The turn-off transistors may be implemented with BJTs, FETs (or related active electronic devices) and the polarity of the transistors may be the same or opposite to that of the CR BJT. Anti-saturation and drive current amplifying circuitry may be provided. A turn-off drive command may be delivered to an appropriate transistor via steering logic or an auto-steering configuration. The circuit is preferably implemented as an integrated circuit.

25 Claims, 6 Drawing Sheets

APPARATUS AND METHOD FOR TURNING OFF BJT USED AS CONTROLLED RECTIFIER

CROSS REFERENCE TO RELATED APPLICATIONS

U.S. patent application having Ser. No. 09/971,047, filed Oct. 3, 2001, and entitled Apparatus and Method for Turning off BJT used as Synchronous Rectifier (by the same inventor as herein) which is hereby incorporated by reference as though it were disclosed in its entirety herein.

U.S. patent application having Ser. No. 09/971,057, filed Oct. 3, 2001, and entitled Apparatus and Method for Control and Driving BJT used as Synchronous Rectifier (by the same inventor as herein) which is hereby incorporated by reference as though it were disclosed in its entirety herein.

U.S. patent application having Ser. No. 09/971,096, filed Oct. 3, 2001, and entitled Apparatus and Method for Control and Driving BJT used as Controlled Rectifier (by the same inventor as herein) which is hereby incorporated by reference as though it were disclosed in its entirety herein.

FIELD OF THE INVENTION

The present invention relates to controlled and synchronous rectifiers and, more specifically, to the rapid, efficient and economical turn-off of a bipolar junction transistor (BJT) used as a controlled or synchronous rectifier.

BACKGROUND OF THE INVENTION

In the text that follows prior art related to synchronous and controlled rectifiers and related uses of BJTs is discussed. It should be recognized that BJTs have been seldom used as controlled rectifiers and for this reason a good part of the following prior art discussion is directed towards synchronous rectifiers and related uses of BJTs.

DC to DC switching mode power converters are typically used to stabilize or isolate a power supply signal from upstream irregularities (i.e., voltage/power surges, momentary power outages, etc.). Various transformer and non-transformer based power converters are known in the art. These power converters typically employ a rectifying device to convert either a transformed AC signal, a chopped DC or a similar signal (depending on the power converter arrangement) into a DC output signal. This output DC signal constitutes a relatively stable power supply signal. Depending on the range of voltage (and current) for which the power converter is designed, the power converter may be used, for example, in power supplies for personal electronic devices, laptop or personal computers, engineering workstations and Internet servers. While the present invention is particularly concerned with electronic/digital logic circuits, it should be recognized that the teaching of the present invention are applicable to rectifying device operation in any voltage/current range and for any purpose.

For many years the standard power supply voltage level for electronic logic circuits was 5V. Recently, this voltage level has dropped in many instances to 3.3V and 2.5V, and there are plans within the industry to further reduce this voltage level. As this voltage level drops, however, the forward voltage drop of the rectifying device becomes the dominant source of power loss and inefficiency. For example, a Schottky diode is typically used when a low voltage drop is desired, and a typical Schottky diode has a 500 mV forward voltage drop. This limits the theoretical efficiency of a DC to DC power converter to 80% at two volts output (before other power conversion losses are taken into account). This efficiency limit further drops to less than 67% at one volt output, and 50% at 500 mV output. These efficiency limits are deemed unacceptable.

In addition to concerns about forward voltage drop and other power inefficiencies, power converters and rectifying devices therein are expected to have high power densities. This mandates a higher switching frequency such that less energy is processed in each switching cycle, which in turn permits smaller component sizes. Switching frequencies have risen from 5 to 20 Khz thirty years ago (where the push was to get above the audible range) up to 100 KHz to 1 MHz at present. Thus, technology that does not support rapid switching is not preferred for most rectification applications.

With respect to known rectifying devices, these include rectifying diodes (PN and Schottky junction in Si, GaAs, etc.) and rectifying transistors (bipolar and field effect). The forward voltage drop of a rectifying diode can be reduced by design, but only to around 300 mV to 200 mV before a point of diminishing returns is reached where increasing reverse leakage current losses outweigh the decreasing conduction losses. This is due to an inherent physical limit of rectifying diodes and does not depend on semiconductor material or whether the construction is that of a conventional P-N junction diode or a Schottky junction diode. For this reason, amongst others, diodes are not desirable as rectifying devices for low voltage level applications.

Rectifying transistors in which transistor driving is in "synchronism" with the direction of current flow across the transistor have increased in popularity due to their favorable forward voltage drops relative to diodes. Typically, the synchronous rectifying transistor is driven "on" to provide a low forward voltage drop when current flow across the rectifying transistor is in a designated forward direction, and is driven "off" to block conduction when current flow across the rectifying transistor would be in the opposite direction.

Both the Bipolar Junction Transistor (BJT) and the Metal-Oxide-Semiconductor Field Effect Transistor (MOSFET) have been used as a synchronous rectifier transistor, also termed a "synchronous rectifier" (SR). Although the BJT has a longer history of use as an SR, the MOSFET is used almost exclusively at present due to its fast switching speed and perceived ease of driving. BJTs are little used as SRs at present due to slow switching speeds in general, and a slow turn-off in particular.

BJTs are even less used, as alluded to above, as controlled rectifiers (CRs). A difference between a SR and a CR is that a SR prevents conduction when a voltage of negative polarity is applied across the rectifier, whereas a CR can prevent conduction when a voltage of either polarity is applied across the rectifier. It should be recognized that a device configured to perform CR is capable of performing SR if it is turned off only during application of a negative polarity across the rectifier, but the converse is not true. Accordingly, when the term "controlled rectifier" or "CR" is used herein, it generally includes the function of a synchronous rectifier unless such function is implicitly or explicitly excluded.

An advantage of controlled rectification over synchronous rectification in switching mode power converters is that the average output voltage or current of an isolated power converter can be regulated from the output side by modulation of the CR conduction duty cycle. With multiple outputs, the voltage or current of each output can be independently controlled.

With respect to the use of MOSFETS as CRs, the construction of conventional power MOSFETs prevents their use as a true CR, and the technique of controlled rectification is little known in the field of switching mode power converters. While FETs are the dominant SR device at present, FETs cannot block a negative voltage and thus are not truly capable of CR, despite terminology to the contrary in some prior art patents discussed below. Two back-to-back FETs can block voltage in both directions and have been used occasionally where the ability to conduct current in either direction is useful, typically when the input or output is AC. Their double voltage drop, however, has prevented any attempted use as a CR.

The present invention recognizes that the BJT is a conductivity modulated device whereas the MOSFET is not. As a result of this distinction, the BJT can achieve a lower forward voltage drop for a given forward current density and reverse voltage blocking capability. A major technical cost of the lower voltage drop, however, is the presence of a conductivity modulating charge stored during the forward conduction which must be removed before the BJT can sustain a forward or reverse voltage without high leakage currents. Removal of this charge entails a turn-off "storage time" that results in an inherently slower turn-off in BJTs than is achievable with MOSFETs which do not have such a stored charge. The lower conduction voltage of the BJT could be used to advantage at lower output voltages, however, if the BJT turn-off speed could be improved (in a cost-effective manner) which is a purpose of the present invention.

Various prior art circuits for turning off a BJT are discussed below after the following definitions and notes. These prior art arrangements include those that turn-off a BJT used as a conventional transistor and those that turn-off a BJT used as a synchronous rectifier. There is also one arrangement of a BJT used as a controlled rectifier.

Definitions and Notes

In the following discussion, and for the remainder of this document, the following definitions and subsequent notes generally apply to circuits using BJTs as controlled or synchronous rectifiers unless otherwise stated or intrinsically implied:

1) A "transistor" is an active (controllable) semiconductor device with at least three electrodes, such that the signal present at one electrode controls the state of conduction between the other two electrodes.

2) The generic term Field Effect Transistor (FET) is used to include the Junction Field Effect Transistor (JFET) as well as the MOSFET, which in turn is used generically for any Insulated Gate FET (or IGFET), including the less commonly used Metal-Insulator-Semiconductor FET (MISFET) device.

3) A "positive" voltage will be that which is normally applied to the collector of a BJT relative to the emitter, or to the drain of a FET relative to the source, when the device is operating as a conventional transistor; a "negative" voltage will be one of reverse polarity.

4) The collector voltage of a BJT will be said to be "above" the emitter voltage when it is of a positive polarity (as defined above), and will be said to be "below" the emitter voltage when it is of a negative polarity, hence "above" is used generally as synonymous with "positive" and "below" is used generally as synonymous with "negative".

5) A "positive" current flow is one which occurs in normally conducting BJTs and FETs, i.e., from collector to emitter, regardless of device polarity; a "negative" current flow is in the reverse direction.

6) A BJT conducting a given collector current with the collector voltage above the base voltage is said to be in a "linear" region of operation, and is not considered to be in an "on" state in switching applications. In the linear region, the collector voltage falls quickly with small increases in base current. When the collector voltage falls below the base voltage the BJT enters a region of "quasi-saturation" where a significant stored charge begins to accumulate in the transistor, and an increasingly large base current is required to lower the collector voltage further. At some relatively high base current the BJT enters the region of "full", "hard" or "deep" saturation where further increases in base current do not cause a significant decrease in collector voltage, and eventually the collector voltage begins to rise slightly with increasing base current. A BJT is thus "on" in switching applications when it is in quasi or deep saturation.

7) A BJT "anti-saturation" circuit is one which decreases the base drive current when the collector voltage falls below some low level, and prevents the BJT from entering deep saturation.

8) A "power" transistor is a relatively high current (typically greater than one ampere) BJT or FET serving as a conventional transistor or, in the present application, as a controlled or synchronous rectifier.

9) The essentially symmetrical structure of a BJT allows it to be operated in an "inverted" mode, where the function of the collector and emitter are interchanged. The terms "emitter" and "collector" will be used in their functional context, wherein the magnitude of the emitter current of a conducting BJT is the sum of the base and collector currents of the same polarity, and is therefore larger in absolute value than either the base or collector current.

10) The structure of a power MOSFET is normally asymmetrical, as are some integrated circuit (IC) FETs, with the body of the FET shorted to the source terminal. Low voltage FETs used in ICs may be essentially symmetrical, with the FET body connected to the substrate or to a supply voltage. In the case of a symmetrical FET construction, the terms "source" and "drain" are used in their functional context in a circuit.

11) An NPN BJT and an N-channel FET are considered to be of the same "polarity" whether the FET is a MOSFET or a JFET.

12) A PNP BJT and a P-channel FET are considered to be of the same polarity and of opposite polarity to an NPN BJT or an N-channel FET.

13) Unless otherwise defined, diodes may consist of: a P-N semiconductor junction; a metal-semiconductor junction (i.e., a Schottky diode); or a diode connected transistor, wherein the base of a BJT is connected to the collector or the gate of a MOSFET is connected to the drain, or a like device. For a given semiconductor material, the forward voltage drop of a Schottky diode is less than that of a P-N junction diode or a diode connected BJT. The forward conduction voltage drop of a diode connected MOSFET is determined by the drain current vs. gate voltage relationship, which depends significantly on design and construction, but is typically greater than that of a P-N junction diode or diode connected BJT.

14) The terms "rectifier" and "diode" are often used synonymously, although there are distinctions: a rectifier is a device that allows current to pass in only one direction, whereas a diode is (at least functionally) a two terminal device that may be used as a rectifier.

Note that definitions (3), (4) and (5) above are equivalent to conventional usage when applied to NPN BJTs and N-channel FETs, but are the opposite of conventional usage when applied to PNP BJTs and P-channel FETs. This is done to achieve terms in the claims that are independent of the polarity of device used. Also note that:

1) The polarity of an entire circuit may be changed by changing the polarity of all transistors, and reversing the polarity of all diodes, voltage sources and current sources, without changing the essential behavior of the circuit. It is also recognized that FETs may often be substituted for BJTs of the same polarity and vice versa, particularly in a control or logic circuit, without changing the essential nature, function or behavior of the circuit. For this substitution, the collector, base and emitter of a BJT are equivalent to the drain, gate and source electrode of a FET, respectively. The principal limitation of device substitution is that devices must remain of the same type when a matching of characteristics is required.

2) BJTs are conventionally considered to be current driven devices, due to the roughly constant ratio between the base drive and collector currents over several decades of current, during which the base-emitter voltage changes by only a few hundred mV. FETs on the other hand are considered to be voltage driven devices, as the gate-source voltage controls the drain current with essentially no gate current flow under steady state conditions.

3) Base current drive for BJTs (e.g., a turn-on or turn-off drive command as discussed below) is usually shown herein as derived from a voltage source and a current determining resistor, but various well known current source circuits may be used instead.

PRIOR ART

While there are several prior art techniques for turning-off a BJT, not all of these are applicable to turning-off a BJT used as a controlled rectifier. This is because BJTs used as a CR must be capable of rapid turn-off when the applied collector-emitter voltage reverses polarity, whereas in conventional BJT implemented circuits the applied voltage does not reverse polarity. In addition, a BJT used as a CR must be capable of rapid turn-off with an applied voltage of either polarity.

FIG. 1 illustrates a prior art technique for turning a BJT on and off. In FIG. 1, switch 13 connects resistor 10 to the "V+" positive voltage source 14 to supply a turn-on base current IB1 (i.e., "drive command") to BJT 1. Turn-off is accomplished by opening switch 13 and closing switch 15 (as indicated in dashed lines) such that resistor 10 is now coupled to the "V−" negative voltage source 16. A negative base current IB2 is drawn from BJT 1 until it turns off and ceases to conduct significant collector current with an applied voltage, whereafter the base voltage swings negative to V− and base current flow ceases. Voltage sources 14 and 16 are usually in the range of 5–10 V and similar in magnitude and, being somewhat greater than the base-emitter voltage of BJT 1 (typically less than 1 V), the turn-on base current IB1 and turn-off base current IB2 are also similar in magnitude which provides an acceptable switching speed for some applications. For other applications, a "speed-up" capacitor 20 may be placed in parallel with resistor 10 for extra base drive at turn-on and turn-off. This circuit may also be used for CR applications, as long as the magnitude of V− on 16 is greater than the most negative voltage on the collector of BJT 1. If the collector voltage on BJT 1 becomes more negative than V−, then a positive base current flows through the base-collector junction of BJT 1, turning it on in the inverted mode, thus preventing it from functioning as a rectifier. A drawback of this turn-off approach is the requirement for an additional, negative drive supply voltage greater in magnitude that the most negative BJT 1 collector voltage. The turn-off switching speed is typically too slow for CR applications, due to an overdrive into deep saturation at lower collector currents and similar IB1 and IB2 magnitudes.

FIG. 2 illustrates another prior art approach for driving a BJT that utilizes a transformer. When switch 13 is closed, current ID1 flowing through resistor 11 from voltage source 14 is transformed by transformer 17 to base current IB1 in BJT 1, turning the transistor on. Opening switch 13 and closing switch 15 (as indicated in dashed lines) causes the current ID2 in resistor 11 to flow through an oppositely phased winding of 17, causing the negative turn-off base current IB2 to flow. Current IB2 is again usually similar in magnitude to IB1, and switching speed is similar to that achieved in FIG. 1. Advantages of the embodiment of FIG. 2 include only a single base drive supply voltage and that the transformer drive allows BJT 1 to be isolated from the drive circuit. Disadvantages include that the negative base voltage applied during the BJT 1 "off" state must be larger than the most negative collector voltage, as discussed above. A further disadvantage lies in the use of a drive transformer which is relatively large and generally too expensive for cost sensitive applications. The drive transformer also places limitations on the relative "on" and "off" periods of BJT 1. Finally, a negative collector-emitter voltage causes BJT 1 to conduct in the inverted mode, preventing use of this drive method in CR or SR applications.

FIG. 3 shows a prior art BJT turn-off technique which eliminates both the drive transformer and the need for a negative drive supply voltage by placing a low value resistor 18 between the base and emitter terminals of BJT 1. When switch 13 is closed, voltage source 14 supplies a drive current ID through resistor 12. Part of current ID flows into the base of BJT 1 as IB1, while the remainder flows as IR through resistor 18. When switch 13 is opened, the current IR in resistor 18 supplies a negative base drive current IB2. A disadvantage of this circuit is that the drive current ID must now be larger than the "on" base drive IB1 by the amount of the turn-off current IB2, increasing drive power losses, particularly if a large IB2 current is desired for faster turn-off. The turn-off drive current IB2 also decreases as turn-off progresses and the base-emitter voltage of BJT 1 drops as the stored charge is removed, slowing the turn-off somewhat. Furthermore, the circuit of FIG. 3 cannot be used directly for CR or SR applications because a negative collector voltage causes a reverse current to flow through resistor 18 and the base-collector junction of BJT 1, turning it "on" in the inverted mode.

FIG. 4 shows another prior art technique for turning off a BJT. Resistor 18 of FIG. 3 is replaced by a turn-off transistor 3 placed between the base and emitter of BJT 1. When switch 13 is closed, resistor 10 supplies base current IB1 from voltage source 14. When switch 13 opens and switch 15 closes, a base current IB3 is supplied to BJT 3 from source 14 through resistor 19. Due to the current gain of BJT 3, a very low impedance is provided between the base and emitter of BJT 1. The BJT 1 reverse base current magnitude IB2 can be much larger than IB1, even with IB3 less than IB1, greatly accelerating the turn-off of BJT 1 if the internal base resistance is sufficiently low. This circuit cannot be used for CR applications, however, for the same reason discussed above for the circuit of FIG. 3.

There are additional prior art BJT driving schemes that have been adapted for SR applications. The circuit of FIG.

5 has been extracted from FIG. 5 of U.S. Pat. No. 5,905,368, issued to Kolluri et al., on May 18, 1999, for a Method and Apparatus for Enabling a Step-Up or Step-Down Operation Using a Synchronous Rectifier Circuit (the '368 patent). The '368 patent illustrates a synchronous rectifying BJT Q1 that is a PNP type of transistor instead of the NPN type used for illustration herein. The '368 patent attempts to overcome the limitations of the embodiment of FIG. 3 herein by placing a Schottky diode D3 in series with base-emitter resistor R1. This prevents the turn-on of Q1 in the inverted mode when the collector voltage reverses. The R1–D3 circuit, however, does not provide a turn-off drive when the Q1 collector voltage reverses and turn-off will be relatively slow, although controlled rectification is otherwise possible.

Other prior art circuits provide some form of "self driving" for a BJT used as a SR based on voltages or currents present in the rectification circuit. Examples of these circuits are shown in FIGS. 6 and 7.

FIG. 6 is a reproduction of FIG. 1 of U.S. Pat. No. 4,716,514, issued to Patel on Dec. 29, 1987, for a Synchronous Power Rectifier. When primary side transistors Q1 and Q2 are on and SR Q3 is to conduct, it is turned on by the voltage on the N2 winding of transformer T1 producing a current flow in R1. When Q1 and Q2 turn-off, the voltage on N2 reverses and turns Q3 off (in a manner similar to FIG. 1), while Q4 is turned on by the voltage on the N2 winding of inductor L1 causing a current to flow in resistor R2. A problem arises when Q1 and Q2 turn back on as the voltage on N2 of L1 tries to keep Q4 on when it must be turned off. This problem is solved by the addition of winding N4 to transformer T1 which forces Q4 to turn-off by reversing the base current flow of Q4 through diode D3. Advantages are that no drive voltage supplies are required for turn-on or turn-off, and no additional magnetic devices are required, but disadvantages are several. Extra windings are generally required on the existing magnetics and turn-off drive may be delayed from that which would give the lowest losses. Most importantly, the available drive currents vary with changes in operating voltages; a severe example occurs when the output (Vo) is overloaded and the voltage falls to near zero, providing no drive voltage to turn-on Q4 (when Q3 is off) until the voltage on Q4 becomes relatively high. This SR BJT driving method also does not provide for controlled rectification.

Current transformers have been proposed a number of times to drive BJT synchronous rectifiers, as illustrated in U.S. Pat. No. 3,582,758 (issued to Gunn); U.S. Pat. No. 3,909,700 (issued to Ferro) and U.S. Pat. No. 3,940,682 (issued to Park et al). A basic example of this approach is shown in FIG. 7, and the anode (A) and cathode (K) of the illustrated NPN type SR BJT are labeled (note that this labeling is reversed for a PNP type SR BJT). When the voltage on terminal 24 is somewhat higher than that on terminal 25 a current begins to flow through windings 22 and 23 of transformer 21 into the base of BJT 1 and turns it on. Under steady state conditions the ratio of collector to base currents is essentially equal to the turns ratio of winding 23 to winding 22. When the voltage on terminal 24 reverses, a reverse current initially flows through winding 22 and produces a negative base drive current through winding 23, which turns BJT 1 off.

Advantages of the current transformer are an optimal level of base drive for varying collector currents, an absolute minimum of base drive power, and no need for base drive voltage sources. Besides the need for a transformer, the greatest disadvantages are a relatively slow turn-on and turn-off unless additional circuitry is employed, as discussed by Eiji Sakai and Koosuke Harada in "A New Synchronous Rectifier Using Bipolar Transistor Driven by Current Transformer", published in the proceedings of the IEEE INTELEC 1992 conference, pp. 424–429.

An attempt has also been made to adapt current transformer drive to BJT controlled rectification. FIG. 8 has been extracted from FIG. 1 of U.S. Pat. No. 4,323,962 (issued to Steigerwald on Apr. 6, 1982, for a High Efficiency Rectifier with Multiple Outputs), with new designators to avoid confusion with those used in this patent. (Note that the equivalent of winding 22 of FIG. 7 herein has been moved from the collector to the emitter side of the BJT rectifier in FIG. 8, and is designated as winding 92). In the device of Steigerwald, an opto-isolator 98 is used in series with the base drive winding, which will prevent base current flow and allow BJT 97 to remain "off" when the collector voltage is positive until the opto-isolator turns on. It would be inadvisable to attempt turn-off once BJT 97 is conducting, as the base drive current would be forced to flow through the "off" opto-isolator by the current in the emitter winding and would likely result in damage unless the circuit is further modified. This limits controlled rectification to "leading edge" modulation of the conduction period, when "trailing edge" modulation is the preferred approach for fast dynamic response in the control loop. Other disadvantages are the same as for a current transformer driven SR.

In view of this and related prior art, it should be apparent that a need does exist for turning off a BJT used as a controlled or synchronous rectifier in a cost effective manner that provides rapid switching, adequate reverse current blocking, the ability to be driven off with lower current drive signals, and the ability to turn-off a BJT CR at any time with a collector voltage of either polarity, amongst other characteristics.

SUMMARY OF THE INVENTION

Accordingly, it is an object of the present invention to provide a low cost, high speed manner of turning off a power bipolar junction transistor which is used as a controlled rectifier.

It is also an object of the present invention to provide such a circuit that operates with low drive power requirements. For low cost and higher speed performance, it is preferred that no transformers or inductors be required in the power BJT drive circuit. A single drive supply voltage is also preferred.

It is desired that the drive circuit be realizable as a semiconductor integrated circuit (IC) and that the drive IC be located in the same package as the power BJT or even integrated onto the same semiconductor "chip" as the power BJT. Realization as an IC requires that the drive circuit consist almost exclusively of diodes, transistors and resistors, with capacitor requirements limited to small integratable capacitors or external "drive voltage bypass" capacitors.

These and related objects of the present invention are achieved by use of an apparatus and method for turning off a BJT used as a controlled rectifier as described herein.

In one embodiment, the present invention includes a bipolar junction transistor (BJT) configured for use as a controlled rectifier (CR); a first turn-off transistor coupled between the base and collector electrodes of the of the CR BJT and having a second electrode adapted to receive a CR BJT turn-off drive command; and second turn-off transistor coupled between the base and emitter electrodes of the CR BJT and having a second electrode adapted to receive a CR BJT turn-off drive command; wherein each of said turn-off transistors is configured such that in the absence of a turn-on drive command at said CR BJT and the presence of a turn-off drive command at the respective one of said turn-off transistors to conduct stored charge out of the collector-base junction of said CR BJT.

In another embodiment, the present invention includes a bipolar junction transistor (BJT) configured for use as a controlled rectifier (CR); a first turn-off transistor coupled between the base and collector electrodes of the CR BJT and having a second electrode adapted to receive a CR BJT turn-off drive command, said first turn-off transistor being configured to rapidly removed stored charge from the base-collector junction of the CR BJT when the collector-emitter voltage of the CR BJT is of a negative polarity; and a second turn-off transistor coupled between the base and emitter electrodes of said CR BJT and having a second electrode adapted to receive a CR BJT turn-off drive command, said second turn-off transistor being configured to rapidly removed stored charge from the base-collector junction of the CR BJT when the collector-emitter voltage of the CR BJT is of a positive polarity.

In yet another embodiment, the present invention includes a bipolar junction transistor (BJT) configured for use as a controlled rectifier (CR), a first active electronic device coupled between the collector and base electrodes of the CR BJT and configured to rapidly removed stored charge from the collector-base junction of the CR BJT, and a second active electronic device coupled between the base and emitter electrodes of the CR BJT and configured to rapidly remove stored charge from the collector-base junction of the CR BJT.

The first and second turn-off transistors may be BJT or FET or some other active electronic devices or a combination thereof. The first and second transistors may be of the same or different polarity as the CR BJT or a combination thereof.

The present invention may also include anti-saturation circuitry, drive current amplifying circuitry and/or drive current steering circuitry, amongst other features.

The attainment of the foregoing and related advantages and features of the invention should be more readily apparent to those skilled in the art, after review of the following more detailed description of the invention taken together with the drawings.

BRIEF DESCRIPTION OF THE DRAWINGS

FIG. 14 includes drive current amplification circuitry.

Figure 1:
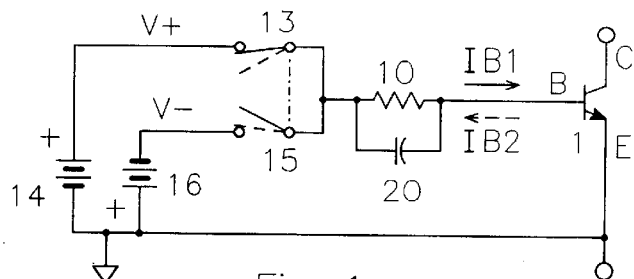
FIGS. 1–4 are schematic diagrams of prior art circuits for turning off a BJT used in a conventional transistor switching circuit.
Figure 2:
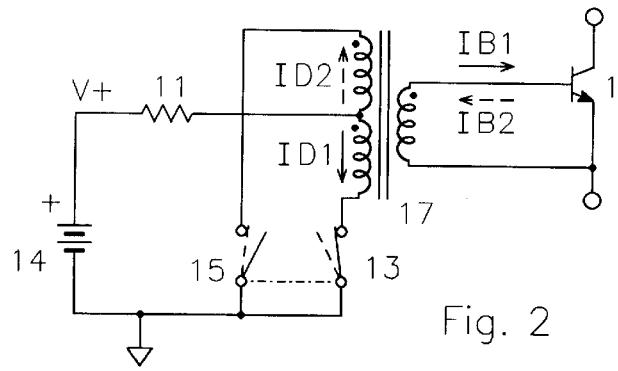
Figure 3:
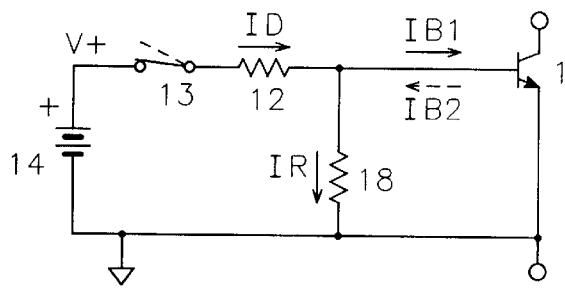
Figure 4:
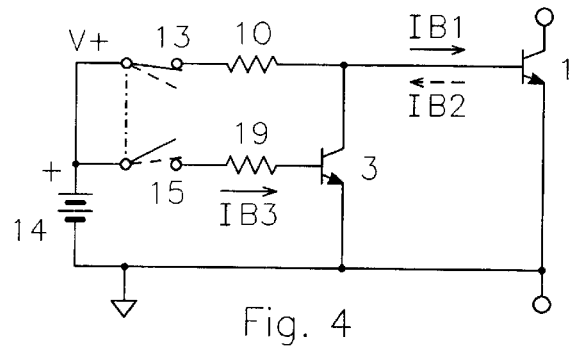
Figure 5:
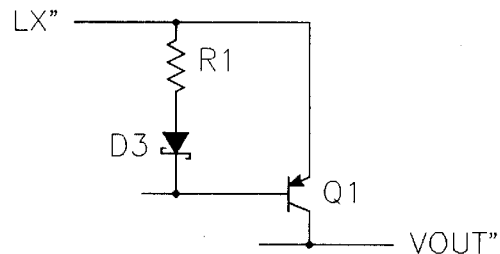
FIGS. 5–7 are schematic diagrams of prior art circuits for turning off a BJT used as a synchronous rectifier.
Figure 6:
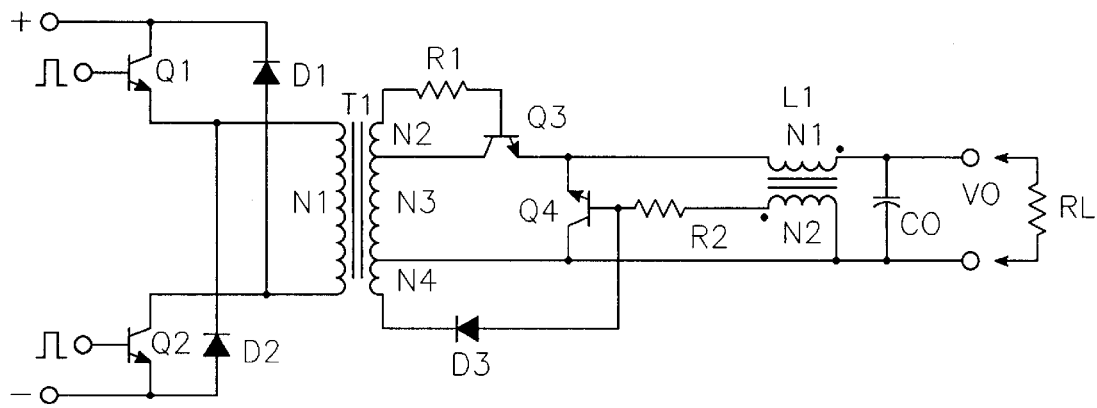
Figure 7:
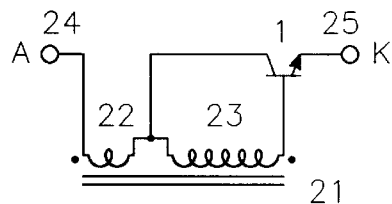
Figure 8:
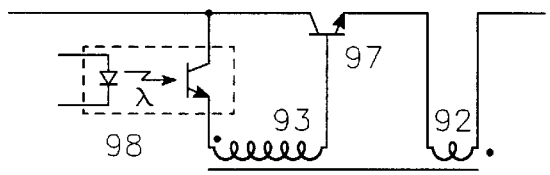
FIG. 8 is a schematic diagram of a prior art circuit for turning off a BJT used as a controlled rectifier.

It should be recognized that various figures use the same designators when the similarly designated components serve the same function (with the exceptions of FIGS. 5, 6 and 8 which are reproductions from prior art documents).

DETAILED DESCRIPTION

Figure 9:
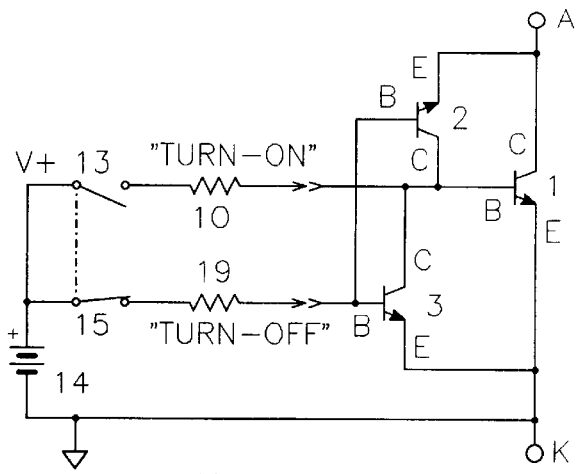
FIG. 9 is a schematic diagram of a circuit for turning off a BJT used as a controlled rectifier in accordance with the present invention.

Referring to FIG. 9, a schematic diagram of a circuit for turning off a BJT used as a controlled rectifier (CR) in accordance with the present invention is shown. It is to be understood that the BJT rectifier of FIG. 9 (and others herein) can be used to provide either synchronous or controlled rectification, depending on the arrangement and activation of transistor(s) coupled to it. For simplicity of expression, the term controlled rectifier (CR) is used generally herein to refer to the BJT rectifier used in FIG. 9 and the remaining figures.

In the embodiment of FIG. 9, the CR BJT 1 is preferably an NPN power transistor and has a conventionally arranged collector (C), base (B) and emitter (E). The collector and emitter of BJT 1 are also labeled as the anode (A) and cathode (K), respectively, consistent with the direction of current flow in a conventional rectifying diode. Note that for a PNP BJT used as a CR, the collector would function as the CR cathode and the emitter as the CR anode.

Active electronic devices are preferably coupled to CR BJT 1 for the purpose of accelerating the turn-off of that transistor. In the embodiment of FIG. 9, the active electronic devices are preferably implemented as BJTs 2,3 of the same polarity (NPN type) as CR BJT 1. These BJTs effectively function as "turn-off" BJTs. The collector, base and emitter electrode of turn-off transistors 2,3 are appropriately labeled (C,B,E). The collector of BJT 2 is coupled to the base of BJT 1 and the emitter of BJT 2 is coupled to the collector of BJT 1. The collector of BJT 3 is coupled to the base of BJT 1 and the emitter of BJT 3 is coupled to the emitter of BJT 1. The base of BJT 2 is coupled to the base of BJT 3 and the "TURN-OFF" drive input.

A pair of function representing switches 13 and 15 selectively couple a drive signal through resistor 10 or 19 to BJT 1 or to BJTs 2 and 3, respectively. It should be recognized that switches 13 and 15 and current forming resistors 10 and 19 are intended to represent the function of applying drive commands to each of BJTs 1-3. This function can be provided in a plurality of ways. For example, as an alternative to the illustrated "switches," sensing and feedback circuits may be utilized that monitor the collector-emitter voltage of BJT 1 and provide appropriate drive current to the bases of BJTs 1 and 2,3 to turn them on and off as discussed herein. The present invention involves preferred timing and magnitude considerations for the generated drive signals. Outside of these and related considerations, the mechanisms through which the drive commands are generated (as mentioned in note 3 above) are the subject of an above-mentioned co-pending patent application (U.S. Ser. No. 09/971,096 and entitled Apparatus and Method for Control and Driving of BJT Used as Controlled Rectifier) and are largely outside the present invention. For that reason, in the figures that follow, the drive signal generating circuits are not shown or discussed.

With respect to operation of the embodiment of FIG. 9, when BJT 1 is "on" a base drive current is supplied by the external circuitry of voltage source 14, (closed) switch 13 and resistor 10. During this "on" period a stored charge is built up in BJT 1 which must be removed to accomplish turn-off. Turn-off of BJT 1 is initiated by opening switch 13 and closing switch 15 as shown, which provides a turn-off drive command current from voltage source 14 to the common base connection for BJTs 2,3 through external resistor 19. The turn-off drive current in resistor 19 is typically smaller than the turn-on drive current in resistor 10. When the BJT 1 collector voltage is still above the emitter voltage, the base-emitter voltage of BJT 3 will be greater (more positive) than that of BJT 2, and the drive current will flow through the base-emitter junction of BJT 3. Due to the high current gain obtainable with low voltage BJTs, the reverse (turn-off) base current drawn from BJT 1 may be several hundred times the drive current supplied by resistor 19, which can remove the stored charge from BJT 1 very quickly and provide a fast turn-off.

If at any time during, or prior to, the turn-off process the collector voltage of BJT 1 goes below the emitter voltage, then the base-emitter voltage of BJT 2 will be greater than that of BJT 3. The turn-off drive from resistor 19 will now flow through BJT 2, turning BJT 2 on instead of BJT 3. Stored charge in BJT 1 is now removed by BJT 2 to the collector of BJT 1, which again turns off quickly, and the reversed collector voltage is sustained by the reverse biased base-emitter junction of BJT 1. Once BJT 1 is "off" and the collector voltage is below the emitter voltage, there is still a small minimum apparent "leakage" current which is the turn-off base drive to BJT 2 flowing out of the BJT 2 emitter (unless the turn-off drive is removed after BJT 1 is off).

An advantage of the circuit of FIG. 9 is that the turn-off drive is automatically routed to the appropriate turn-off transistor. A disadvantage of this circuit is that BJT 2 or 3 will be driven into deep saturation during the "off" period, which will cause it to turn-off slowly when BJT 1 is turned back on and the turn-off drive command to BJTs 2 and 3 is removed. A minor disadvantage of the circuit of FIG. 9 is that when either BJT 2 or 3 is deeply saturated it places sufficient forward biased collector-base voltage onto the other transistor to turn it on slightly in the inverted mode. This in turn causes an increase in "reverse leakage" current when the BJT 1 collector voltage is below the emitter voltage, and a noticeable "forward leakage" current when forward biased BJT 1 is being held off as a CR.

The undesirable effects of deep saturation of BJTs 2 or 3 can be overcome, however, by the use of any suitable "anti-saturation" technique. These techniques include, but are not limited to, the following. It should also be recognized that use of a turn-off drive command of sufficiently short duration (long enough to turn the turn-off transistor on, but not long enough to drive it into unrecoverable deep saturation) may be used as an anti-saturation technique.

Figure 10:
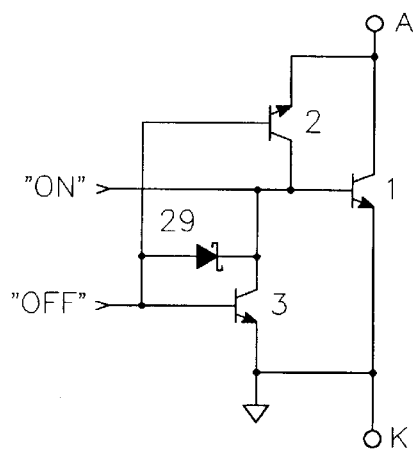
FIGS. 10–14 are schematic diagrams of circuits similar to that of FIG. 9 that incorporate some form of anti-saturation in accordance with the present invention.

Referring to FIG. 10, the circuit of FIG. 9 having an anti-saturation technique in accordance with the present invention is shown. A Schottky diode 29 is placed between the common base connection point of BJTs 2,3 and the base of BJT 1 (which is also common to the collectors of BJTs 2,3). When the collector voltage of BJT 2 or 3 falls below the base voltage (typically by a few 100 mV) the Schottky rapidly diverts a large part of the base drive current into the corresponding collector, preventing a further drop in collector voltage, which is still low enough to ensure a rapid turn-off of BJT 1. A sufficiently "large" conventional (non-Schottky) diode may serve for diode 29, as long as the forward drop is at least about 50–100 mV less than the base-emitter voltage of BJT 2 or 3 for the same current.

Figure 11:
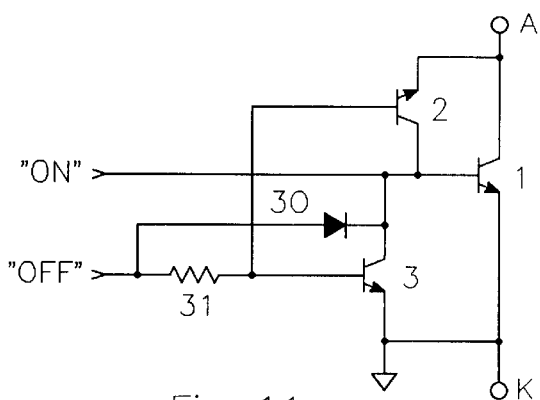
Figure 12:
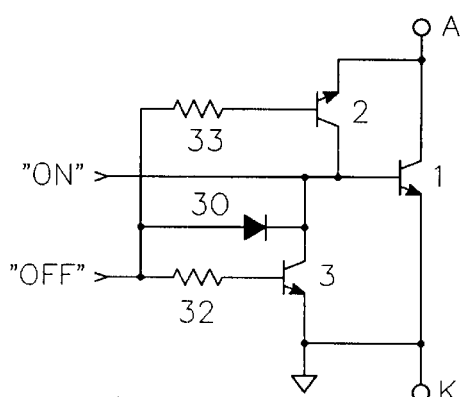
Figure 13:
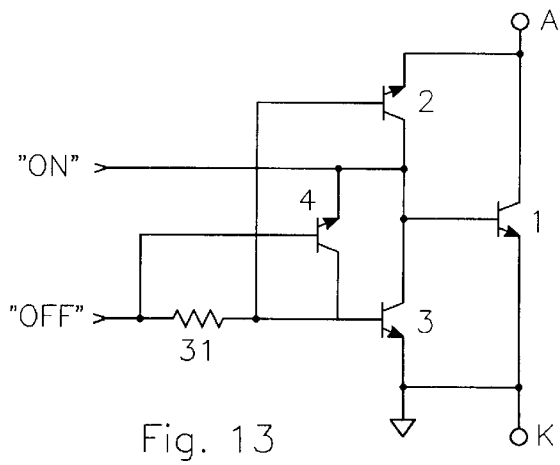

Other circuit techniques to achieve similar anti-saturation results in accordance with the present invention are shown in the embodiments of FIGS. 11–13. In FIG. 11, a resistor 31 is placed in the turn-off drive command path to BJTs 2 and 3, and a diode 30 is placed between the "OFF" input end of resistor 31 and the base of BJT 1. The voltage drop in resistor 31 increases the voltage across the anti-saturation diode 30, and allows a conventional diode to be more readily used. This circuit allows the anti-saturation collector-emitter voltage of BJT 2 and 3 to be adjusted somewhat, with an increase in anti-saturation voltage as the value of resistor 31 is raised. The anti-saturation voltage, however, is less well defined than with the circuit of FIG. 10. For example, the collector-emitter voltage varies more with changes in collector current, and tends towards deep saturation as the collector current drops to the level of the diverted base drive current.

FIG. 12 illustrates a similar circuit to that of FIG. 11, except that resistor 31 of FIG. 11 is replaced by two resistors 32 and 33, with resistor 32 connected to the base of BJT 2 and resistor 33 connected to the base of BJT 3. In FIG. 13, diode 30 of FIG. 11 is replaced by a transistor 4 which is preferably a BJT but may be another type of transistor. The base of BJT 4 is connected to the "OFF" input end of resistor 31, the emitter to the base of BJT 1, and the collector to the common base connection point of BJTs 2 and 3. This circuit combines the well defined anti-saturation voltage of the circuit of FIG. 10 with the adjustability of the circuit of FIG. 11. The "anti-saturated" voltage of BJT 2 or 3 will be essentially the product of the "off" drive current and the value of resistor 31, when BJT 4 has similar characteristics to BJTs 2,3. Thus, the embodiment of FIG. 11 can provide a low and well-defined anti-saturation voltage, or "quasi-saturation" voltage (definition 6 above).

Figure 14:
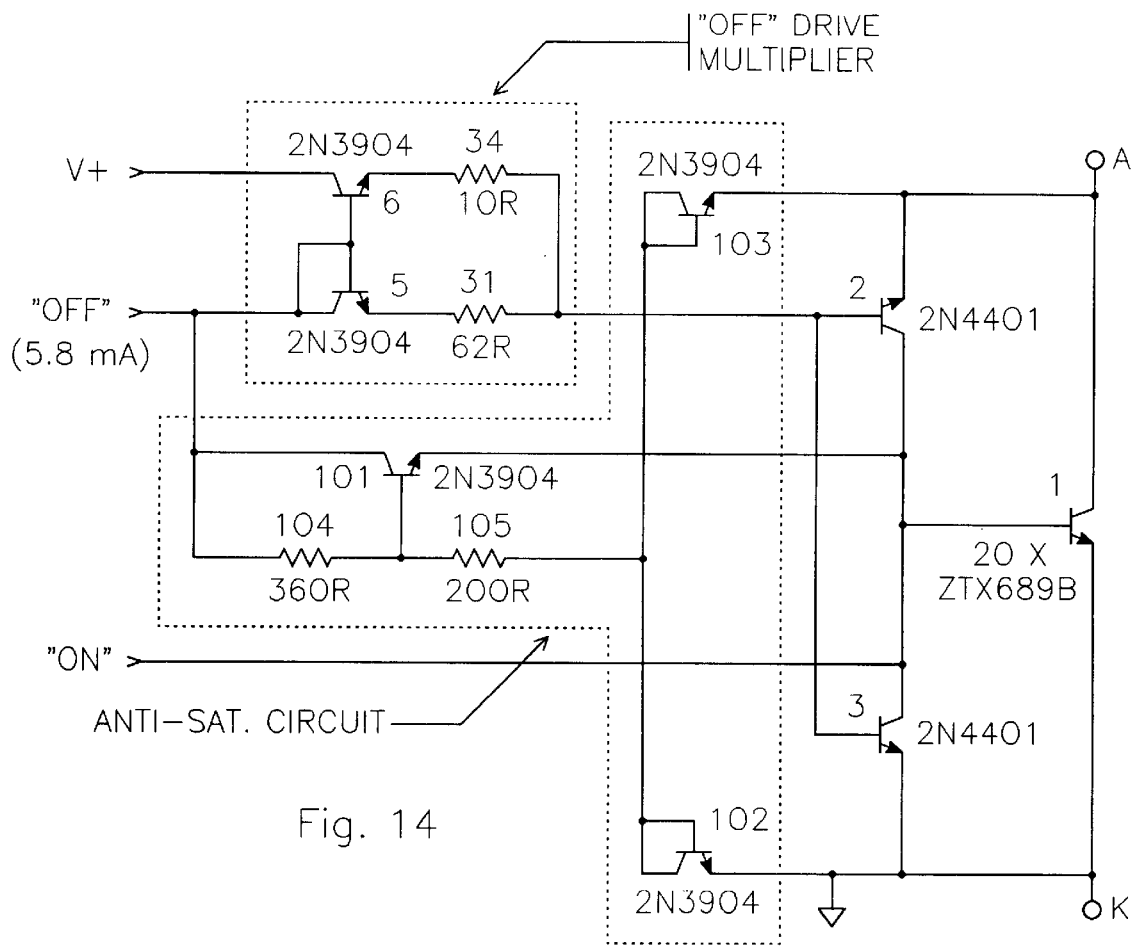

Referring to FIG. 14, a schematic diagram of a more preferred circuit for turning off a BJT used as a CR in accordance with the present invention is shown. The circuit of FIG. 14 is more preferred because it includes several desirable features.

The circuit or embodiment of FIG. 14 is an adaptation of the circuit of FIG. 11, with BJTs 5 and 6 and resistor 34 added to increase the turn-off drive current available to BJTs 2 and 3 over that present at the "OFF" drive input. If, for example, resistor 34 is ⅙ of the value of resistor 31 (as shown), the total "off" drive current available to BJTs 2 and 3 is nearly seven times that present at the "OFF" drive input. Resistors 104, 105 and BJTs 101–103 are added to prevent deep saturation of BJTs 2,3 once BJT 1 is off.

The base-emitter voltage (VBE) of BJTs 2,3, 102 and 103 are similar, so whether BJT 2 or 3 receives the "off" drive, the sum of the voltages on resistors 104, 105 is essentially the same as the sum of the VBE of BJT 5 and the voltage on resistor 31, or about 960 mV in this arrangement (for the illustrated components). The voltage on resistor 105 is a little more than ⅓ of this sum, or about 340 mV. Since the VBE of BJTs 101 and 102 or 103 are also similar, BJT 101 conducts and diverts "off" drive away from BJT 5 when BJT 1 is essentially "off" and the collector-emitter voltage of BJT 2 has fallen to about 340 mV.

An advantage of this circuit over that of FIGS. 10–13 is that the total "off" drive current drawn from the drive supply voltage is reduced significantly once BJT 1 turns off. This reduces the steady state "off" drive power. In contrast, the "off" drive current to BJTs 2 and 3 in FIGS. 10–13 remains constant and is only diverted to the collector of BJTs 2 or 3 to prevent deep saturation.

Figure 15:
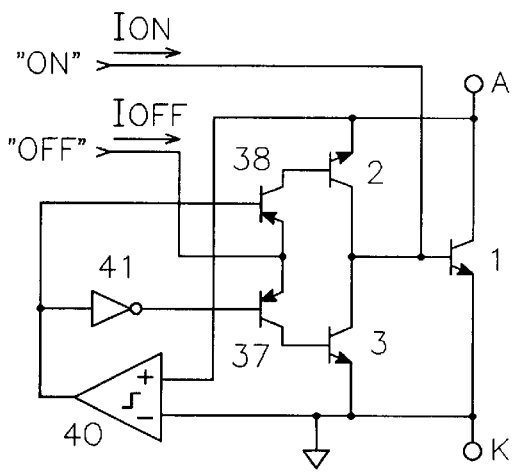
FIGS. 15–23 are schematic diagrams of other circuits for turning off a BJT used as a controlled rectifier in accordance with the present invention.

Referring to FIG. 15, a schematic diagram of another circuit for turning off a BJT used as a CR in accordance with the present invention is shown. The embodiment of FIG. 15 uses a voltage comparator 40 to sense the collector-emitter voltage polarity of BJT 1. A differential pair of transistors 37 and 38 is driven by the comparator output (and the inverse produced by logic inverter 41) to steer the "off" drive current to the appropriate BJT 2 or 3. Anti-saturation circuitry (and/or drive current amplifying circuitry) for BJTs 2 and 3 is not shown in FIG. 15 or other BJTs discussed herein below, but may be provided as discussed above.

An advantage of the circuit of FIG. 15 over those of FIGS. 9–14 is that it has a much sharper "crossover" in driving from BJT 2 to BJT 3. In the circuits of FIGS. 9 through 14 the drive crossover between BJT 2 and 3 requires about a 100 mV change (centered about zero volts) in the collector-emitter voltage of BJT 1. It should also be recognized that for the embodiments of FIGS. 9–15, a negative drive supply voltage is not required and the positive drive supply voltage may be lower than the positive voltage applied to the collector of BJT 1.

FIG. 15 and the figures that follow illustrate many alternative embodiments within the present invention for implementing a CR BJT. Each of these figures includes comparator and steering logic for diverting a turn-off drive command to the appropriate turn-off transistor based on the collector-emitter voltage of the power BJT 1. Various aspects of the embodiments of FIGS. 15–23 may be incorporated into the embodiments of FIGS. 9–14.

Figure 16:
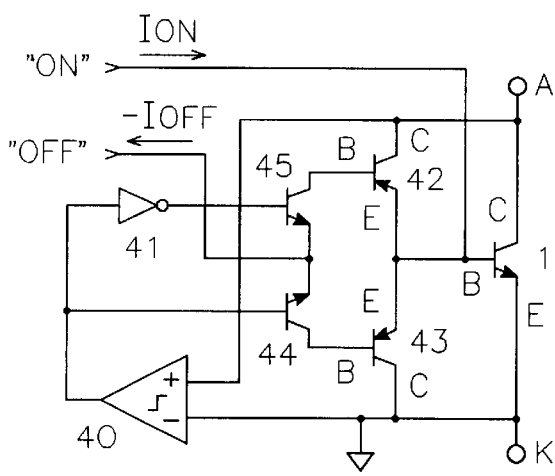

In FIG. 16, an embodiment of the present invention is shown that is similar to that of FIG. 15, but in which the turn-off transistors 42,43 are BJTs of opposite polarity (PNP) to that of BJT 1 (NPN). A comparator senses the BJT 1 collector-emitter voltage and directs the steering logic inverter 41 and BJTs 44,45 to apply the "off" drive command to the appropriate turn-off transistor 42,43. A negative supply voltage is required whose magnitude is greater than the most negative collector voltage on BJT 1. Anti-saturation circuitry for BJTs 42 and 43 is not shown, but may be incorporated as discussed above.

Figure 17:
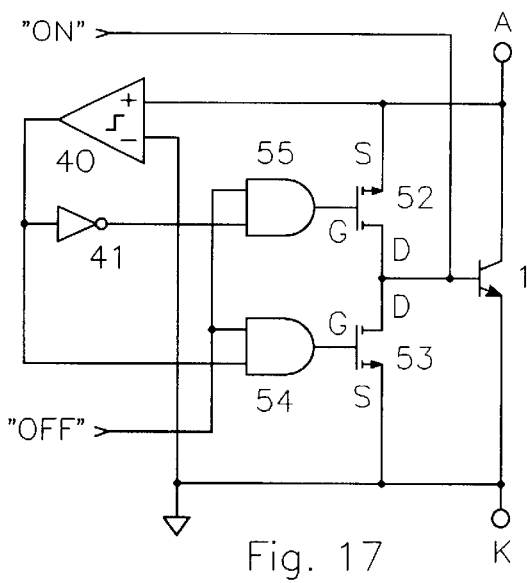

In FIG. 17, an embodiment of the present invention with N-channel MOSFETs as the turn-off transistors 52,53 is shown. In this and subsequent FIGS. 18–20, the source, gate and drain electrodes are appropriately labeled. The circuit of FIG. 17 includes a voltage comparator 40 and "off" drive command steering logic that consists of logic AND gates 54,55 and inverter 41. Since logic gates are typically input voltage sensitive, the "OFF" input in FIG. 17 (and subsequent figures) now consists of a voltage command instead of an "off" current command as in previous embodiments. Likewise, FETs are voltage driven devices, and are shown being driven directly from the logic gate voltage outputs for simplicity. FETs do not need an anti-saturation circuit to minimize their turn-off time, nor to minimize excess BJT 1 "leakage" currents when used as BJT turn-off drivers. However, FETs do need "off" drive command logic steering circuitry to prevent both turn-off FETs from being on (or partially on) at the same time, which would provide a low impedance path between the collector and emitter of BJT 1. The embodiment of FIG. 17 can, in principle, operate from a single drive supply voltage, but a negative supply voltage will be required if the BJT 1 collector voltage can become more negative than the gate conduction threshold voltage of MOSFET 52. In this and subsequent figures the "logic gates" represent a circuit function, and need not incorporate the circuitry of conventional logic gates.

Figure 18:
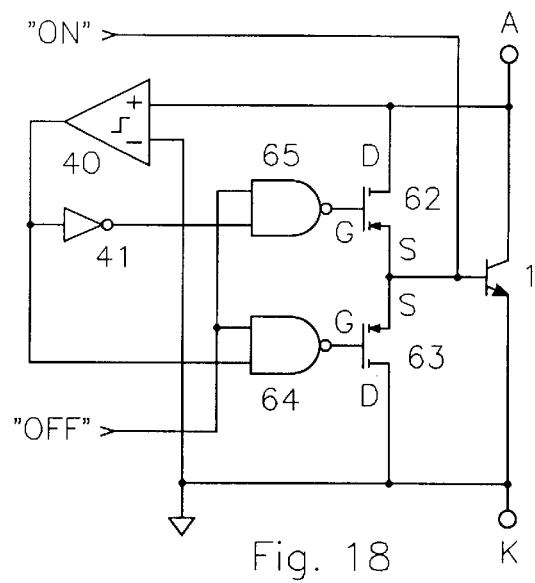

In FIG. 18, an embodiment of the present invention that uses P-channel MOSFETs 62,63 as turn-off transistors is shown. Use of P-channel devices requires that "off" drive command steering gates 64 and 65 be logic NAND gates instead of the logic AND gates in FIG. 17. A negative drive supply voltage is required to drive the P-channel MOSFETs, and that voltage is preferably greater in magnitude than the sum of the most negative collector voltage on BJT 1 and the gate conduction threshold voltage of MOSFET 62 in order to ensure that BJT 1 is held fully off.

Figure 19:
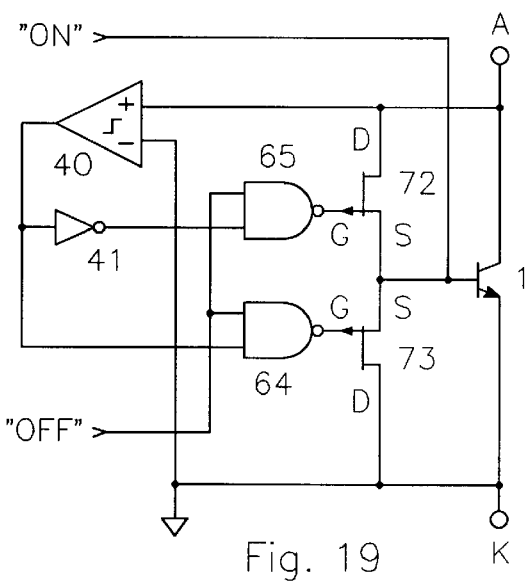

In FIG. 19, an embodiment of the present invention that uses JFETs for the turn-off transistors is shown. JFETs are inherently "depletion" mode devices and as such are normally "on" unless turned off by a reverse polarity gate drive. The embodiment of FIG. 19 uses P-channel JFETs 72,73 to turn-off BJT 1, along with voltage comparator 40, inverter 41 and "off" drive command steering logic NAND gates 64,65. A negative drive supply voltage is required which is at least equal to the most negative collector voltage on BJT 1.

Figure 20:
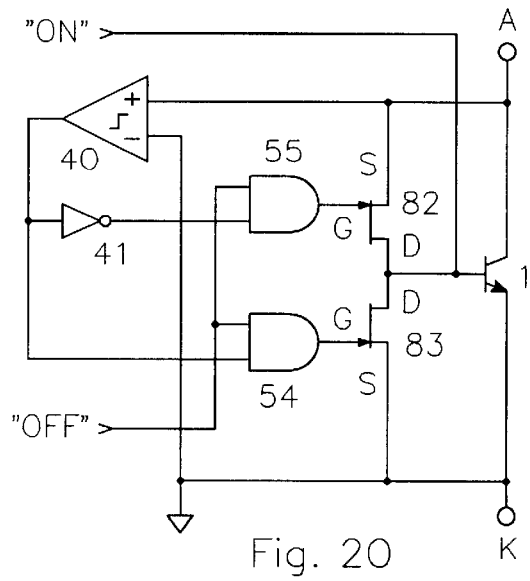

In FIG. 20, an embodiment of the present invention that uses N-channel JFETs 82,83 for the turn-off transistors is shown. The drive steering logic includes AND gates 54,55, voltage comparator 40 and inverter 41, as discussed elsewhere herein. A negative drive supply voltage is required which is greater in magnitude than the sum of the most negative collector voltage on BJT 1 and the gate conduction "pinch-off" voltage of JFET 82.

FIG. 9 through FIG. 20 illustrate circuits in which in each individual circuit the turn-off transistors are of the same type (BJT or FET) and polarity. It should be recognized, however, that this is not necessary, and that the turn-off transistors may be of different type and/or different polarity, with appropriate modifications in steering logic (if needed) and turn-off transistor driving, etc. It is not practical to illustrate all possible combinations and, accordingly, in the text (and figures) that follow a few illustrative and representative combinations are discussed.

Figure 21:
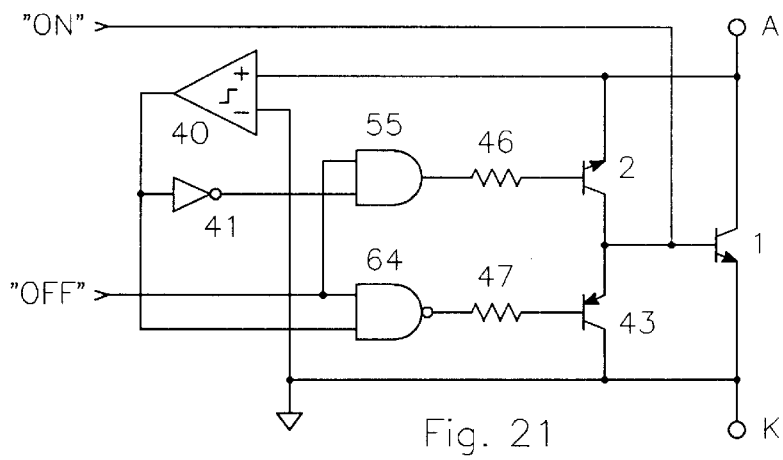

FIG. 21 shows a circuit of the present invention where the first turn-off transistor is an NPN BJT 2, while the second turn-off transistor is a PNP BJT 43. Turn-off transistor drive resistors 46 and 47 convert the logic output voltages to drive currents for the BJT transistors. Thus, the two turn-off transistors are of the same type but a different polarity.

Figure 22:
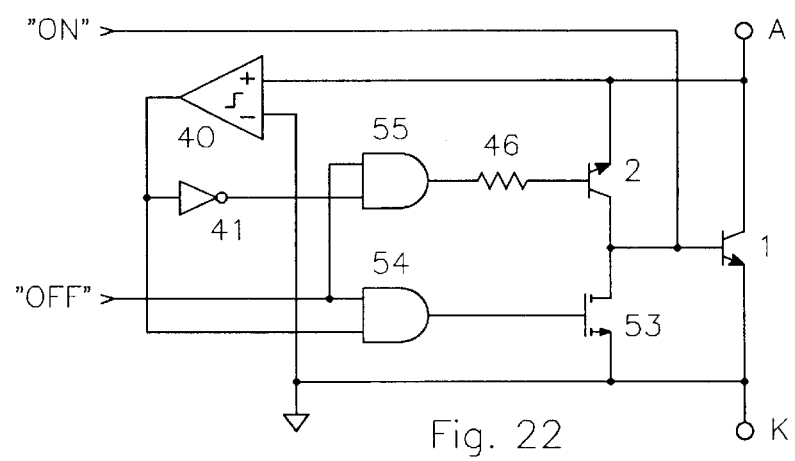

FIG. 22 shows a circuit of the present invention where the second turn-off transistor becomes an N-channel MOSFET 53, while the first turn-off transistor remains an NPN BJT 2 (with drive current determining resistor 46). The two turn-off transistors are now of the same polarity but different types.

Figure 23:
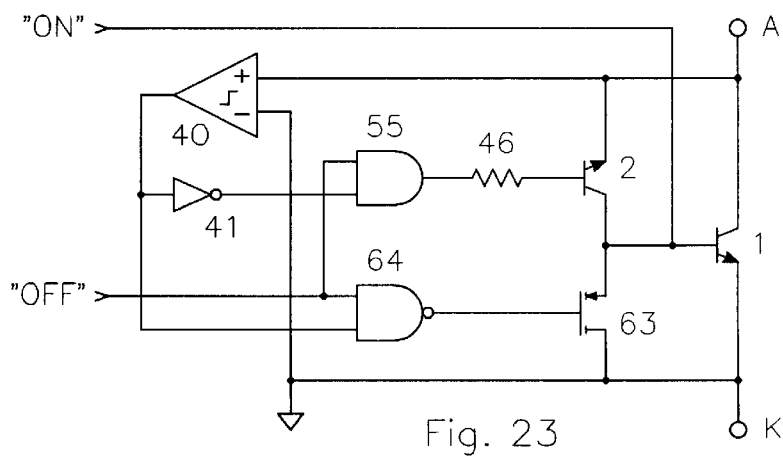

FIG. 23 shows a circuit of the present invention where the second turn-off transistor becomes a P-channel MOSFET 63, while the first turn-off transistor again remains an NPN BJT 2. In this case the two turn-off transistors are of different types and different polarities.

From the preceding figures, it becomes apparent that the present invention may be realized in many different embodiments or implementations, depending for example on the CR BJT polarity, turn-off transistor types, turn-off transistor polarities, anti-saturation circuitry, base current amplifying circuitry, etc. The number of combinations becomes exponential. While it is not prudent to include a figure for each of these combinations, it is to be understood that all are within the scope of the present invention.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. A controlled rectifier circuit, comprising:

a bipolar junction transistor (BJT) configured for use as a controlled rectifier (CR) and having collector, base and emitter electrodes, said base electrode being adapted to receive a turn-on drive command for turning on said CR BJT;

a first turn-off transistor having a first electrode coupled to the base electrode, a third electrode coupled to the collector electrode, and a second electrode adapted to receive a CR BJT turn-off drive command; and a second turn-off transistor having a first electrode coupled to the base electrode, a third electrode coupled to the emitter electrode, and a second electrode adapted to receive a CR BJT turn-off drive command;

wherein each of said turn-off transistors is configured such that in the absence of a turn-on drive command at said CR BJT and the presence of a turn-off drive command at the respective one of said turn-off transistors to conduct stored charge out of the collector-base junction of said CR BJT.

2. The circuit of claim 1, wherein at least one of said first and second turn-off transistors is a BJT of the same polarity as the CR BJT, and the first, second and third electrodes of that turn-off transistor are the collector, base and emitter electrodes, respectively.

3. The circuit of claim 1, wherein at least one of said first and second turn-off transistors is a BJT of the opposite polarity as the CR BJT, and the first, second and third electrodes of that turn-off transistor are the emitter, base and collector electrodes, respectively.

4. The circuit of claim 1, wherein at least one of said first and second turn-off transistors is a field effect transistor (FET) of the same polarity as the CR BJT, and the first, second and third electrodes of that turn-off transistor are the drain, gate and source electrodes, respectively.

5. The circuit of claim 1, wherein at least one of said first and second turn-off transistors is a field effect transistor (FET) of the opposite polarity as the CR BJT, and the first, second and third electrodes of that turn-off transistor are the source, gate and drain electrodes, respectively.

6. The circuit of claim 1, wherein at least one of said first and second turn-off transistors is a BJT having collector, base and emitter electrodes, and said circuit further comprises anti-saturation circuitry associated with this BJT turn-off transistor to prevent that transistor from being driven into deep saturation by a CR BJT turn-off drive command that is delivered to the base electrode of that BJT turn-off transistor.

7. The circuit of claim 6, wherein said anti-saturation circuitry includes a diode, coupled between the collector and base electrodes of the BJT turn-off transistor, that conducts to prevent deep saturation of that transistor.

8. The circuit of claim 6, wherein said anti-saturation circuitry includes an anti-saturation transistor, coupled between the collector and base electrodes of the BJT turn-off transistor, that conducts to prevent deep saturation of the BJT turn-off transistor.

9. The circuit of claim 6, wherein said anti-saturation circuitry includes a resistor coupled between an input of a CR BJT turn-off drive command and the base electrode of said BJT turn-off transistor.

10. The circuit of claim 1, further comprising:

a turn-off drive command input; and a circuit coupled between said turn-off drive command input and the second electrode of at least one of said first and second turn-off transistors that increases the turn-off drive command current available at said second electrode over a corresponding drive command current at said input.

11. The circuit of claim 10, further comprising anti-saturation circuitry associated with at least one of said first and second turn-off transistors for preventing that transistor from being driven into deep saturation.

12. The circuit of claim 11, wherein said anti-saturation circuitry is configured such that a turn-off drive command for the associated transistor is of sufficiently short duration so as to not drive that transistor into deep saturation.

13. The circuit of claim 10, further comprising circuitry that diverts current away from the second electrode of said one of said first and second turn-off transistor to decrease the turn-off drive command to that transistor when the CR BJT is off.

14. The circuit of claim 1, wherein the first and second turn-off transistors are BJTs of the same polarity as the CR BJT, and wherein the second electrodes of said first and second turn-off transistors are coupled such that a turn-off drive command delivered to the second electrodes is automatically routed through an appropriate one of said transistors based on the polarity of the collector-emitter voltage of said CR BJT.

15. The circuit of claim 1, further comprising a comparator having inputs coupled to the collector and emitter electrodes of said CR BJT, said comparator steering a turn-off drive command to the appropriate one of said turn-off transistors based on the polarity of the collector-emitter voltage of said CR BJT.

16. The circuit of claim 15, further comprising logic gates that function in cooperation with said comparator to achieve said steering.

17. A controlled rectifier circuit, comprising:

a bipolar junction transistor (BJT) configured for use as a controlled rectifier (CR) and having collector, base and emitter electrodes, said base electrode being adapted to receive a turn-on drive command for turning on said CR BJT;

a first turn-off transistor having a first electrode coupled to the base of the CR BJT, a third electrode coupled to the collector of the CR BJT, and a second electrode adapted to receive a CR BJT turn-off drive command, said first turn-off transistor being configured to rapidly remove stored charge from the base-collector junction of the CR BJT when the collector-emitter voltage of the CR BJT is of a negative polarity; and a second turn-off transistor having a first electrode coupled to the base of the CR BJT, a third electrode coupled to the emitter of the CR BJT, and a second electrode adapted to receive a CR BJT turn-off drive command, said second turn-off transistor being configured to rapidly removed stored charge from the base-collector junction of the CR BJT when the collector-emitter voltage of the CR BJT is of a positive polarity.

18. The circuit of claim 17, wherein at least one of said first and second turn-off transistors is from the group of transistors including:

a BJT of the same polarity as the CR BJT;

a BJT of opposite polarity to that of the CR BJT;

a FET of the same polarity as the CR BJT; and a FET of opposite polarity to that of the CR BJT.

19. The circuit of claim 17, wherein at least one of said first and second turn-off transistors is a BJT having collector, base and emitter electrodes, and said circuit further comprises anti-saturation circuitry associated with this BJT turn-off transistor to prevent that transistor from being driven into deep saturation by a CR BJT turn-off drive command that is delivered to the base electrode of that BJT turn-off transistor.

20. The circuit of claim 17, wherein the second electrodes of said first and second turn-off transistors are coupled such that a turn-off drive command delivered to the second electrodes is automatically routed through an appropriate one of said transistors based on the polarity of the collector-emitter voltage of said CR BJT.

21. A controlled rectifier circuit, comprising:
    a bipolar junction transistor (BJT) configured for use as a controlled rectifier (CR) and having collector, base and emitter electrodes, said base electrode being adapted to receive a turn-on drive command for turning on said CR BJT;
    a first active electronic device coupled between the collector and base electrodes of the CR BJT and configured to rapidly removed stored charge from the collector-base junction of the CR BJT; and
    a second active electronic device coupled between the base and emitter electrodes of the CR BJT and configured to rapidly remove stored charge from the collector-base junction of the CR BJT.

22. The circuit of claim 21, wherein at least one of said first and second active electronic devices is from the group of active electronic devices including:
    a BJT of the same polarity as the CR BJT;
    a BJT of opposite polarity to that of the CR BJT;
    a FET of the same polarity as the CR BJT; and
    a FET of opposite polarity to that of the CR BJT.

23. The circuit of claim 21, wherein at least one of said first and second active electronic devices is a BJT having collector, base and emitter electrodes, and said circuit further comprises anti-saturation circuitry associated with this BJT turn-off transistor to prevent that transistor from being driven into deep saturation by a CR BJT turn-off drive command that is delivered to the base electrode of that BJT turn-off transistor.

24. The circuit of claim 21, further comprising:
    a turn-off drive command input; and
    a circuit coupled between said turn-off drive command input and the second electrode of at least one of said first and second active electronic devices that increases the turn-off drive command current available at said second electrode over a corresponding drive command current at said input.

25. A controlled rectifier circuit, comprising:
    a bipolar junction transistor (BJT) configured for use as a controlled rectifier (CR) and having collector, base and emitter electrodes, said base electrode being adapted to receive a turn-on drive command for turning on said CR BJT;
    a first turn-off transistor having first, second and third electrodes that is coupled to said CR BJT between the base and collector of said CR BJT, the first electrode being coupled to the base of the CR BJT, the third electrode being coupled to the collector of the CR BJT and the second electrode being adapted to receive a CR BJT turn-off drive command; and
    a second turn-off transistor having first, second and third electrodes that is coupled to said CR BJT between the base and emitter of said CR BJT, the first electrode being coupled to the base of the CR BJT, the third electrode being coupled to the emitter of the CR BJT and the second electrode being adapted to receive a CR BJT turn-off drive command;
    wherein said first turn-off transistor is configured such that in the absence of a turn-on drive command at the base of the CR BJT, the presence of a turn-off drive command at the second electrode of the first turn-off transistor and when the collector-emitter voltage of the CR BJT is of reverse polarity to conduct stored charge out of the collector base junction of the CR BJT to thereby rapidly turn-off the CR BJT; and
    further wherein said second turn-off transistor is configured such that in the absence of a turn-on drive command at the base of the CR BJT, the presence of a turn-off drive command at the second electrode of the second turn-off transistor and when the collector-emitter voltage of the CR BJT is of forward polarity to conduct stored charge out of the collector base junction of the CR BJT to thereby rapidly turn-off the CR BJT.

* * * * *